(12) United States Patent
Etou et al.

(10) Patent No.: US 7,670,745 B2
(45) Date of Patent: Mar. 2, 2010

(54) ALKALI SOLUBLE POLYMER AND POSITIVE WORKING PHOTOSENSITIVE RESIN COMPOSITION USING THE SAME

(75) Inventors: Tomohiro Etou, Ichihara (JP); Eiji Watanabe, Ichihara (JP); Ryouta Mineo, Ichihara (JP)

(73) Assignee: Chisso Corporation, Osaka (JP)

( * ) Notice: Subject to any disclaimer, the term of this patent is extended or adjusted under 35 U.S.C. 154(b) by 192 days.

(21) Appl. No.: 11/979,466

(22) Filed: Nov. 2, 2007

(65) Prior Publication Data

US 2008/0131813 A1 Jun. 5, 2008

(30) Foreign Application Priority Data

Nov. 2, 2006 (JP) ............................. 2006-299052

(51) Int. Cl.
*G03F 7/022* (2006.01)
*C08F 10/14* (2006.01)
*G03F 7/004* (2006.01)

(52) U.S. Cl. ................. 430/189; 430/270.1; 430/280.1; 526/313

(58) Field of Classification Search ....................... None
See application file for complete search history.

(56) References Cited

U.S. PATENT DOCUMENTS 4,384,037 A 5/1983 Hosaka et al. .............. 430/191

5,362,597 A 11/1994 Sano et al. .................. 430/191

FOREIGN PATENT DOCUMENTS

| JP | 51-34711 | 3/1976 |
| JP | 52-41050 | 10/1977 |
| JP | 56-122031 | 9/1981 |
| JP | 05-165214 | 7/1993 |
| JP | 2007-171572 | 7/2007 |

OTHER PUBLICATIONS

Sugita et al , Journal of Polymer Scidnec: Polymer Chemistry Edition, vol. 14, pp. 1901-1913, year 1976, no month given.*
AN 1965:82223, Turfina et al , STN abstract from CAPLUS and RN 1465-78-7 , two pages entered into STN Apr. 22, 2001.*
Aglietto et al , Journal of polymer science: Part A: Polymer Chemistry, vol. 24, pp. 1337-1349, year 1986 no month given.*

* cited by examiner

*Primary Examiner*—Cynthia Hamilton
(74) *Attorney, Agent, or Firm*—Hogan & Hartson LLP

(57) ABSTRACT

The invention provides an alkali soluble polymer including a specific vinylketone phenol and a derivative thereof as radical polymerizable monomers and a positive working photosensitive resin composition containing the alkali soluble polymer and a photosensitizing agent. According to the invention, there can be provided an alkali soluble resin having high solvent resistance, high water resistance, high acid resistance, high alkali resistance, high thermal resistance, high transparency, excellent adhesiveness with a substrate, and the like and useful for the formation of a patterned resin film obtained by developing in an aqueous alkali solution and a positive working photosensitive resin composition including such an alkali soluble resin.

19 Claims, No Drawings

ALKALI SOLUBLE POLYMER AND POSITIVE WORKING PHOTOSENSITIVE RESIN COMPOSITION USING THE SAME

CROSS REFERENCE TO RELATED APPLICATIONS

This application claims priority under 35 U.S.C. § 119 to Japanese Patent Application No. JP 2006-299052, filed Nov. 2, 2006, which application is expressly incorporated herein by reference in its entirety.

BACKGROUND OF THE INVENTION

1. Field of the Invention

The invention relates to an alkali soluble polymer and a positive working photosensitive resin composition using the same, which can be available in the filed of photo-resist and the like.

2. Related Art

Patterned transparent films have been used in many parts of display devices such as spacers, insulating films, and protective films and many positive working photosensitive resin compositions have been proposed for these uses (see, e.g., JP 51-34711 A; JP 56-122031 A; and JP 5-165214 A). In addition, there is known a positive working photosensitive resin composition containing a polymer using 4-hydroxy styrene as a monomer (see, e.g., JP 52-41050 B).

In general, electronic parts, such as liquid crystal display devices having thin-film transistors and solid-state image sensing devices are provided with insulating films for insulating between electric wirings arranged in layers. As a material that forms the insulating film, a positive working photosensitive resin composition, that allows the formation of an insulating film having a desired pattern by a small number of steps, is widely used. In addition, the positive working photosensitive resin composition requires a wide process margin in the process of forming an insulating film. Further, an insulating film or a display device using the positive working photosensitive resin composition absolutely require in a latter step of a production making a contact with a solvent, an acid, an alkali solution, or the like by dipping and treating with heat.

SUMMARY OF THE INVENTION

Under the above-mentioned circumstances, a positive working photosensitive resin composition or the like, that allows the formation of a patterned resin film obtained by developing in an aqueous alkali solution, which is excellent in high solvent resistance, high water resistance, high acid resistance, high alkali resistance, high thermal resistance, high transparency, adhesiveness with a substrate, i.e., a transparent film in which a pattern is formed (patterned transparent film), has been demanded.

Similarly, a patterned transparent film, an insulating film, a display device, and the like, which are excellent in high solvent resistance, high water resistance, high acid resistance, high alkali resistance, high thermal resistance, high transparency, adhesiveness with a substrate, and the like, have been also demanded.

It has been discovered that a positive working photosensitive resin composition including an alkali soluble polymer, which is obtained by copolymerization of a monomer (A) represented by the following general formula (I) and another radical polymerizable monomer (B); and a photosensitizing agent, and completed the invention based on such a finding.

[1] The invention provides an alkali soluble polymer, which is obtained by polymerization of a monomer (A) represented by the general formula (1).

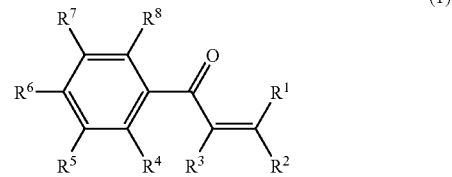

In the general formula (1): $R^1$, $R^2$, and $R^3$ each represent a hydrogen or an alkyl group having 1 to 3 carbon atoms in which any hydrogen may be replaced by a fluorine; and $R^4$, $R^5$, $R^6$, $R^7$, and $R^8$ each represent a hydrogen, a halogen, —CN, —$CF_3$, —$OCF_3$, or —OH, an alkyl group having 1 to 5 carbon atoms in which any —$CH_2$— may be replaced by —COO—, —OCO—, or —CO—, and any hydrogen may be replaced by a halogen, or an alkoxy group having 1 to 5 carbon atoms in which any hydrogen may be replaced by a halogen, provided that at least one of $R^4$ to $R^8$ is —OH.

[2] Further, the invention provides an alkali soluble polymer, which is obtained by copolymerization of a monomer (A) represented by the general formula (1) with a radical polymerizable monomer (B) other than the monomer (A).

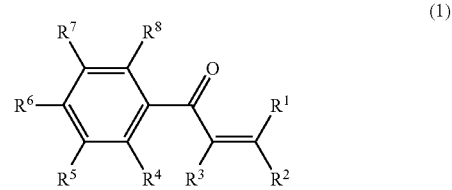

In the general formula (1): $R^1$, $R^2$, and $R^3$ each represent a hydrogen or an alkyl group having 1 to 3 carbon atoms in which any hydrogen may be replaced by a fluorine; and $R^4$, $R^5$, $R^6$, $R^7$, and $R^8$ each represent a hydrogen, a halogen, —CN, —$CF_3$, —$OCF_3$, or —OH, an alkyl group having 1 to 5 carbon atoms in which any —$CH_2$— may be replaced by —COO—, —OCO—, or —CO—, and any hydrogen may be replaced by a halogen, or an alkoxy group having 1 to 5 carbon atoms in which any hydrogen may be replaced by a halogen, provided that at least one of $R^4$ to $R^8$ is —OH.

[3] The invention provides the alkali soluble polymer according to item [2], in which the $R^1$ to $R^5$, $R^7$, and $R^8$ each represent a hydrogen and the $R^6$ represents —OH.

[4] The invention provides the alkali soluble polymer according to item [2], in which the radical polymerizable monomer (B) includes at least one of a radical polymerizable monomer (b1) having an oxiranyl group; a radical polymerizable monomer (b2) having an oxetanyl group; a radical polymerizable monomer (b3) having a N-substituted maleimide; and a radical polymerizable monomer (b4) having a tricyclo[5.2.1.0$^{2,6}$]decanyl group.

[5] The invention provides the alkali soluble polymer according to item [4], in which the radical polymerizable monomer (B) includes one or both of the radical polymerizable monomer (b1) and the radical polymerizable monomer (b2).

[6] The invention provides the alkali soluble polymer according to item [5], in which the radical polymerizable monomer (B) consists of the radical polymerizable monomer (b1), the radical polymerizable monomer (b2), and a radical polymerizable monomer (b5) other than the radical polymerizable monomers (b1) to (b4).

[7] The invention provides the alkali soluble polymer according to item [5], in which the radical polymerizable monomer (B) consists of the radical polymerizable monomers (b1), (b2), and (b3).

[8] The invention provides the alkali soluble polymer according to item [5], in which the radical polymerizable monomer (B) consists of the radical polymerizable monomers (b1), (b2), and (b4).

[9] The invention provides the alkali soluble polymer according to item [5], in which the radical polymerizable monomer (B) consists of the radical polymerizable monomers (b 1), (b3), and (b4).

[10] The invention provides the alkali soluble polymer according to item [5], in which the radical polymerizable monomer (B) consists of the radical polymerizable monomers (b1).

[11] The invention provides the alkali soluble polymer according to item 5, in which the radical polymerizable monomer (B) consists of the radical polymerizable monomers (b1) and (b4).

[12] The invention provides the alkali soluble polymer according to any one of items [6] to [11], in which: the radical polymerizable monomer (b1) is one or two or more selected from the group of glycidyl acrylate, glycidyl methacrylate, and methyl glycidyl methacrylate; the radical polymerizable monomer (b2) is one or two or more selected from the group of (3-ethyl-3-oxetanyl)methyl acrylate, (3-ethyl-3-oxetanyl) methyl methacrylate, (2-ethyl-2-oxetanyl)methyl acrylate, and (2-ethyl-2-oxetanyl)methyl methacrylate; the radical polymerizable monomer (b3) is one or both of N-phenyl maleimide and N-cyclohexyl maleimide; and the radical polymerizable monomer (b4) is tricyclo[5.2.1.0$^{2,6}$]decanyl methacrylate.

[13] The invention provides the alkali soluble polymer according to item [6], in which the radical polymerizable monomer (b5) is one or both of benzyl methacrylate and styrene.

[14] The invention provides a positive working photosensitive resin composition including the alkali soluble polymer according to any one of items [2] to [13] and a photosensitizing agent (C).

[15] The invention provides the photosensitive resin composition according to item [14], in which the photosensitizing agent (C) is an acid generator compound.

[16] The invention provides the positive working photosensitive resin composition according to item [14], in which the photosensitizing agent (C) is a 1,2-quinone diazide compound.

In the specification of the invention, for representing both an acrylic acid and a methacrylic acid, they may be uniformly described as "(meth)acrylic acid." In addition, for representing both an acrylate and a methacrylate in a similar manner, they may be uniformly described as "(meth)acrylate."

"Alkyl group" in the specification of the invention refers to a linear chain or a branched chain alkyl group. Examples thereof include methyl, ethyl, propyl, n-butyl, t-butyl, pentyl, and hexyl.

"Alkenyl group" in the specification of the invention refers to an alkenyl group having a linear chain or branched chain with 1 to 3 double bonds. Specific examples include ethenyl, 1-propenyl, 2-propenyl, 1-methylethenyl, 1-butenyl, 2-butenyl, 3-butenyl, 2-methyl-2-propenyl, 1-pentenyl, 2-pentenyl, 4-pentenyl, 3-methyl-2-butenyl, 1-hexenyl, 2-hexenyl, 1-heptenyl, 2-heptenyl, 1-octenyl, 2-octenyl, 1,3-octadienyl, 2-nonenyl, 1,3-nonadienyl, and 2-decenyl.

"Alkynyl group" refers to an alkynyl group having a linear chain or branched chain with 1 to 3 triple bonds. Specific examples include ethynyl, 1-propynyl, 2-propynyl, 1-butynyl, 2-butynyl, 3-butynyl, 1-pentynyl, 2-pentynyl, 4-pentynyl, 1-octynyl, 6-methyl-1-heptynyl, and 2-decynyl.

The positive working photosensitive resin composition of the invention has the characteristics generally demanded of polymer compositions, such as high solvent resistance, high water resistance, high acid resistance, high alkali resistance, high thermal resistance, high transparency, and adhesiveness with a substrate.

Further, the invention can provide a positive working photosensitive resin composition without using any radical polymerizable monomer having a carboxyl group.

In addition, the positive working photosensitive resin composition of the invention can be excellent in solvent resistance, acid resistance, alkali resistance, thermal resistance, and transparency. Therefore, resin films such as a transparent film, an insulating film, and a display device, using the positive working photosensitive resin composition of the invention hardly cause a rough surface on the resin film even after carrying out an after treatment such as immersion in a solvent, an acidic solution, and an alkali solution or contact therewith, and a thermal treatment, in the latter steps of the process of manufacturing the resin film. As a result, the resin film such as a transparent film, prepared using the positive working photosensitive resin composition of the invention shows an increase in optical transmittance and also an increase in display quality of a display device using such a resin film.

DETAILED DESCRIPTION OF THE INVENTION

1 Alkali Soluble Polymer

The alkali soluble polymer of the invention is a polymer having an alkali solubility to the extent that, when a film of 0.01 to 100 μm in thickness formed by spin-coating with a solution and heating at 120° C. for 30 minutes is dipped in 2.38% by weight of an aqueous tetramethyl ammonium hydroxide solution at, for example, about 25° C. for 5 minutes, followed by washing the film with pure water, the film is not remained at all.

1-1 First Alkali Soluble Polymer

A first alkali soluble polymer of the invention is a polymer, which is obtained by polymerizing a monomer (A) represented by the general formula (1). The monomer (A) may be used in the form of a single kind of monomer or may be used in combination of two or more kinds of monomers.

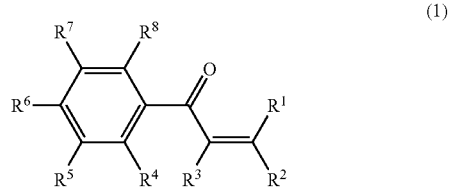

(1)

In the general formula (1), $R^1$, $R^2$, and $R^3$ each represent a hydrogen or an alkyl group having 1 to 3 carbon atoms in which any hydrogen may be replaced by a fluorine; and $R^4$, $R^5$, $R^6$, $R^7$, and $R^8$ each represent a hydrogen, a halogen, —CN, —CF$_3$, —OCF$_3$, —OH, an alkyl group having 1 to 5 carbon atoms in which any —CH$_2$— may be replaced by —COO—, —OCO—, or —CO—, and any hydrogen may be replaced by a halogen, or an alkoxy group having 1 to 5 carbon atoms in which any hydrogen may be replaced by a halogen, provided that at least one of $R^4$ to $R^8$ is —OH.

The first alkali soluble polymer of the invention can be obtained by radical polymerization of the monomer (A). The radical polymerization can be carried out using a known polymerization initiator. The first alkali soluble polymer of the invention is expected to be used for a patterned resin film in the field of photo-resist technology.

1-2 Second Alkali Soluble Polymer

A second alkali soluble polymer of the invention is a polymer, which is obtained by polymerization of a monomer (A) represented by the general formula (1) with a radical polymerizable monomer (B) other than the monomer (A). In other words, the alkali soluble polymer is a copolymer, which is obtained by polymerization of a monomer mixture. In the second alkali soluble polymer, the content of the monomer (A) is not particularly limited so far as the copolymer of the monomer (A) with the radical polymerizable monomer (B) shows the aforementioned alkali solubility, but preferably approximately 0.5 to approximately 85% by weight, more preferably approximately 1 to approximately 80% by weight, still more preferably approximately 5 to approximately 80% by weight.

Further, the content of the radical polymerizable monomer (B) is preferably approximately 15 to approximately 99.5% by weight, more preferably approximately 20 to approximately 99% by weight, still more preferably approximately 20 to approximately 95% by weight.

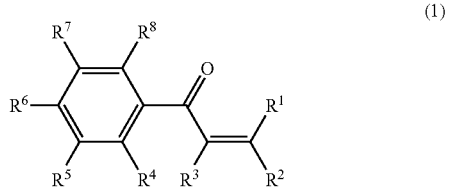

(1)

In the general formula (1), $R^1$, $R^2$, and $R^3$ each represent a hydrogen or an alkyl group having 1 to 3 carbon atoms in which any hydrogen may be replaced by a fluorine; and $R^4$, $R^5$, $R^6$, $R^7$, and $R^8$ each represent a hydrogen, a halogen, —CN, —CF$_3$, —OCF$_3$, —OH, an alkyl group having 1 to 5 carbon atoms in which any —CH$_2$— may be replaced by —COO—, —OCO—, or —CO—, and any hydrogen may be replaced by a halogen, or an alkoxy group having 1 to 5 carbon atoms in which any hydrogen may be replaced by a halogen, provided that at least one of $R^4$ to $R^8$ is —OH.

In addition, with respect to the alkali soluble polymer of the invention, the monomer component can be estimated such that, for example, the alkali soluble polymer is thermally decomposed and the gas generated by the thermal decomposition is then determined by GC-MS.

1-2-1 Monomer (A) Represented by General Formula (1)

The monomer (A) is a radical polymerizable monomer having a group derived from a vinyl ketone derivative as a polymerizable group on a phenol derivative. The monomer (A) may be used in the form of a single kind of monomer or may be used in combination of two or more kinds of monomers. By the use of an alkali soluble polymer prepared using such a radical polymerizable monomer, a patterned transparent film having a high solubility to an aqueous alkali solution in the developing process, i.e., having a high developing property, can be easily obtained. In addition, the resulting film shows solvent resistance, high water resistance, high acid resistance, high alkali resistance, high thermal resistance, and high transparency, as well as high adhesiveness with a substrate.

When the polymerization is performed for the second alkali soluble polymer, the amount of the monomer (A) used is preferably approximately 0.5 to approximately 85% by weight, more preferably approximately 1 to approximately 80% by weight with respect to the total weight of the whole monomers. When the monomer (A) is used in such a range, the transparent film obtained from the positive working photosensitive resin composition of the invention can be provided with improved solvent resistance, water resistance, acid resistance, alkali resistance, thermal resistance, transparency, and the like.

Examples of the monomer (A) preferably include compounds in which each of $R^1$ to $R^5$, $R^7$, and $R^8$ is a hydrogen and $R^6$ is —OH. Hereinafter, the monomer (A) also refers to as "monomer A."

1-2-2 Radical Polymerizable Monomer (B) other than Monomer (A)

The radical polymerizable monomer (B) may be any of radical polymerizable monomers other than the monomer (A), preferably which do not include a radical polymerizable monomer having a carboxyl group. Examples of the radical polymerizable monomer (B) include a radical polymerizable monomer (b1) having an oxiranyl group, a radical polymerizable monomer (b2) having an oxetanyl group, a radical polymerizable monomer (b3) having a N-substituted maleimide, a radical polymerizable monomer (b4) having a tricyclo[5.2.1.0$^{2,6}$]decanyl group, and another radical polymerizable monomer (b5) other than these monomers. Of those, the preferable are (b1) to (b4).

The radical polymerizable monomer (B) may be one or two or more radical polymerizable monomers selected from the group of the radical polymerizable monomers (b1) to (b4). The radical polymerizable monomer (B) preferably contains one or both of radical polymerizable monomers (b1) and (b2), more preferably contains all of the radical polymerizable monomers (b1) to (b4). Further, within the range not impairing the effect of the invention, the radical polymerizable monomer (B) may further contain a radical polymerizable monomer (b5) other than radical polymerizable monomers (b1) to (b4). For instance, the radical polymerizable monomer (B) may be formed of the radical polymerizable monomer (b1), may be constructed of the radical polymerizable monomers (b1), (b2), and (b5), may be constructed of radical polymerizable monomers (b1), (b2), and (b3), may be constructed of radical polymerizable monomers (b1), (b2), and (b4), may be constructed of radical polymerizable monomers (b1), (b3), and (b4), or may be constructed of radical polymerizable monomers (b1) and (b4).

Hereinafter, the radical polymerizable monomer (B) will be described. In the following description, the radical polymerizable monomer (B) also refers to as "monomer B." In addition, the radical polymerizable monomer (b1) having an oxiranyl group, the radical polymerizable monomer (b2) having an oxetanyl group, the radical polymerizable monomer (b3) having a N-substituted maleimide group, the radical polymerizable monomer (b4) having a tricyclo[5.2.1.0$^{2,6}$] decanyl group, and the another radical polymerizable monomer (b5) are also referred to as "monomer b1," "monomer b2," "monomer b3," "monomer b4," and "monomer b5," respectively.

1-2-2-1 Radical Polymerizable Monomer (b1) having Oxiranyl Group

The radical polymerizable monomer (b1) having an oxiranyl group, which can be specifically contained as a monomer B to be used in the invention, is not particularly limited so far as it contains such a functional group. Specific examples of the monomer b1 include glycidyl (meth)acrylate, methyl glycidyl (meth)acrylate, α-ethyl acrylic acid glycidyl ester, and 3,4-epoxycyclohexyl (meth)acrylate.

In the above specific examples, glycidyl acrylate, glycidyl methacrylate, methyl glycidyl methacrylate, or 3,4-epoxycyclohexyl methacrylate are easily obtainable and the resulting patterned transparent films are preferable in terms of increasing solvent resistance, water resistance, acid resistance, alkali resistance, thermal resistance, transparency, and the like.

The monomer b1 may be used in the form of a single kind of monomer or may be used in combination of two or more kinds of monomers.

When the polymerization is performed for the alkali soluble polymer of the invention, the monomer b1 is preferable in terms of controlling the characteristic properties of the alkali soluble polymer. The monomer b1 is preferably used in the range of approximately 5 to approximately 90% by weight, more preferably in the range of approximately 10 to approximately 80% by weight with respect to the total weight of the whole monomers. When the monomer b1 is used in such a range, various characteristics of the transparent film obtained from the positive working photosensitive resin composition of the invention, such as solvent resistance, water resistance, acid resistance, alkali resistance, thermal resistance, and transparency, can be further improved.

1-2-2-2 Radical Polymerizable Monomer (b2) having Oxetanyl Group

The radical polymerizable monomer (b2) having an oxetanyl group, which can be specifically contained as a monomer B to be used in the invention, is not particularly limited so far as it contains such a functional group. Specific examples of the monomer b2 include (3-methyl-3-oxetanyl)methyl(meth) acrylate, (3-ethyl-3-oxetanyl)methyl (meth)acrylate, (3-methyl-3-oxetanyl)ethyl (meth)acrylate, (3-ethyl-3-oxetanyl) ethyl (meth)acrylate, (2-methyl-2-oxetanyl)methyl(meth) acrylate, (2-ethyl-2-oxetanyl) methyl (meth)acrylate, p-vinylphenyl-3-ethyloxetanyl-3-ylmethyl ether, 2-phenyl-3-(meth)acryl oxymethyloxetane, 2-trifluoromethyl-3-(meth)acryloxymethyloxetane, and 4-trifluoromethyl-2-(meth)acryloxymethyloxetane.

When an alkali soluble polymer, in which at least one selected from these radical polymerizable monomers is used as a monomer B, is used, a patterned transparent film having a high solubility to an aqueous alkali solution, i.e., having a high developing property, can be easily obtained. In addition, it is also preferable in terms of increasing solvent resistance, high water resistance, high acid resistance, high alkali resistance, high thermal resistance, high transparency, and adhesiveness to a substrate.

Among the above specific examples, (3-ethyl-3-oxetanyl) methyl (meth)acrylate and (2-ethyl-2-oxetanyl)methyl (meth)acrylate can be easily obtained and preferable in terms of increasing the solvent resistance, water resistance, acid resistance, alkali resistance, thermal resistance, and transparency of the patterned transparent film thus obtained.

The monomer b2 may be used in the form of a single kind of monomer or may be used in combination of two or more kinds of monomers.

When the polymerization is performed for the alkali soluble polymer of the invention, the monomer b2 is preferable in terms of controlling the characteristic properties of the alkali soluble polymer. The monomer b2 is preferably used in the range of approximately 1 to approximately 80% by weight, more preferably in the range of approximately 5 to approximately 30% by weight with respect to the total weight of the whole monomers. When the monomer b2 is used in such a range, various characteristics of the transparent film obtained from the positive working photosensitive resin composition of the invention, such as solvent resistance, water resistance, acid resistance, alkali resistance, thermal resistance, and transparency, can be further improved.

1-2-2-3 Radical Polymerizable Monomer (b3) having N-Substituted Maleimide

The radical polymerizable monomer (b3) having an N-substituted maleimide, which can be specifically contained as a monomer B to be used in the invention, is not particularly limited so far as it contains such a functional group. Specific examples of the monomer b3 include N-methyl maleimide, N-ethylmaleimide, N-butylmaleimide, N-cyclohexylmaleimide, N-benzylmaleimide, N-phenylmaleimide, N-(4-acetylphenyl)maleimide, N-(2,6-diethylphenyl)maleimide, N-(4-dimethyl amino-3,5-dinitrophenyl) maleimide, N-(1-anilinonaphthyl-4)maleimide, N-[4-(2-benzoxazolyl) phenyl]maleimide, and N-(9-acridinyl)maleimide.

When an alkali soluble polymer using at least one selected from these radical polymerizable monomers is used, a patterned transparent film having a high solubility to an aqueous alkali solution, i.e., having a high developing property, can be easily obtained. In addition, it is also preferable in terms of increasing solvent resistance, high water resistance, high acid resistance, high alkali resistance, high thermal resistance, high transparency, and adhesiveness to a substrate.

Among the above specific examples, N-cyclohexyl maleimide and N-phenyl maleimide can be easily obtained and preferable in terms of increasing the solvent resistance, water resistance, acid resistance, alkali resistance, thermal resistance, and transparency of the patterned transparent film thus obtained.

The monomer b3 may be used in the form of a single kind of monomer or may be used in combination of two or more kinds of monomers.

When the polymerization is performed for the alkali soluble polymer of the invention, the monomer b3 is preferable in terms of controlling the characteristic properties of the alkali soluble polymer. The monomer b3 is preferably used in the range of approximately 1 to approximately 80% by weight, more preferably in the range of approximately 5 to approximately 30% by weight with respect to the total weight of the whole monomers. When the monomer b3 is used in such a range, various characteristics of the transparent film obtained from the positive working photosensitive resin composition of the invention, such as solvent resistance, water resistance, acid resistance, alkali resistance, thermal resistance, and transparency, can be further improved. In particular, it is more effective in terms of improving thermal resistance and decreasing dielectric constant.

1-2-2-4 Radical Polymerizable Monomer (b4) having Tricyclo[$5.2.1.0^{2,6}$]decanyl Group The radical polymerizable monomer (b4) having a tricyclo [$5.2.1.0^{2,6}$]decanyl group, which can be specifically contained as a monomer B to be used in the invention, is not particularly limited so far as it contains such a functional group. Specific examples of the monomer b4 include tricyclo [$5.2.1.0^{2,6}$]decanyl (meth) acrylate.

When an alkali soluble polymer using at least one selected from these radical polymerizable monomers is used, a patterned transparent film having a high solubility to an aqueous alkali solution, i.e., having a high developing property, can be easily obtained. In addition, it is also preferable in terms of being easily obtainable and increasing solvent resistance, high water resistance, high acid resistance, high alkali resistance, high thermal resistance, high transparency, and adhesiveness to a substrate.

The monomer b4 may be used in the form of a single kind of monomer or may be used in combination of two or more kinds of monomers.

When the polymerization is performed for the alkali soluble polymer of the invention, the monomer b4 is preferable in terms of controlling the characteristic properties of the alkali soluble polymer. The monomer b4 is preferably used in the range of approximately 1 to approximately 80% by weight, more preferably in the range of approximately 5 to approximately 30% by weight with respect to the total weight of the whole monomers. When the monomer b4 is used in such a range, various characteristics of the transparent film obtained from the positive working photosensitive resin composition of the invention, such as solvent resistance, water resistance, acid resistance, alkali resistance, thermal resistance, and transparency, can be further improved. In particular, it is more effective in terms of improving thermal resistance and decreasing dielectric constant.

1-2-2-5 Another Radical Polymerizable Monomer (b5)

When the polymerization is performed for an alkali soluble polymer, which is obtained by copolymerization of the monomer A with the radical polymerizable monomer (B) (e.g., monomer b1, monomer b2, monomer b3, and monomer b4), considering a process margin or the like of the developing property or the like as described above, within the range that does not have much effect on the solvent resistance, water resistance, acid resistance, alkali resistance, thermal resistance, transparency, and the like of the patterned transparent film thus obtained, any of other radical polymerizable monomer b5 other than the monomers b1 to b4 can be used. The monomer b5 may be used in the form of a single kind of monomer or may be used in combination of two or more kinds of monomers.

Specific examples of the monomer b5 include styrene, methylstyrene, vinyltoluene, chlormethylstyrene, (meth) acrylamide, dicyclopentenyl(meth)acrylate, dicyclopentenyloxyethyl (meth)acrylate, benzyl (meth)acrylate, isobomyl (meth)acrylate, (meth)acrylic acid, methyl(meth)acrylate, ethyl (meth)acrylate, cyclohexyl (meth)acrylate, butyl (meth) acrylate, phenyl(meth)acrylate, glycerolmono (meth)acrylate, anhydrous maleic acid, anhydrous itaconic acid, polystyrene macromonomer, polymethyl methacrylate macromonomer, N-acryloylmorpholine, and indene.

Among the above specific examples, the positive working photosensitive resin composition prepared by copolymerization of at least one selected from the group of styrene, methyl (meth)acrylate, ethyl (meth)acrylate, benzyl (meth)acrylate, cyclohexyl (meth)acrylate, and polystyrene macromonomer is preferable because of good developing property and extremely high solvent resistance, water resistance, acid resistance, alkali resistance, thermal resistance, and transparency.

When the polymerization is performed for the alkali soluble polymer of the invention, the monomer b5 is preferable in terms of controlling the characteristic properties of the alkali soluble polymer. The monomer b5 is preferably used in the range of approximately 1 to approximately 80% by weight, more preferably in the range of approximately 5 to approximately 50% by weight with respect to the total weight of the whole monomers.

1-2-3 Polymerization Process for Alkali Soluble Polymer

Even though a polymerization process for preparing an alkali soluble polymer is not particularly limited, the alkali soluble polymer can be obtained by polymerization of a mixture of the monomer A and the monomer B, and preferable is the radical polymerization thereof in a solution using a solvent. The polymerization temperature is not particularly limited so far as the temperature causes the generation of a sufficient amount of radicals from a polymerization initiator to be used. In general, however, the temperature is in the range of approximately 50° C. to approximately 150° C. The polymerization time period is also not particularly limited, but is generally in the range of approximately 3 to approximately 24 hours. In addition, the polymerization may be carried out under the pressure applied by pressurization, depressurization, or atmospheric pressure.

The solvent, which can be used in the aforementioned polymerization reaction, is preferably one that dissolves the monomer A, the monomer B, and an alkali soluble polymer to be generated. Specific examples of the solvent include methanol, ethanol, 1-propanol, 2-propanol, acetone, 2-butanone, ethyl acetate, propyl acetate, tetrahydrofuran, acetonitrile, dioxane, toluene, xylene, cyclohexanone, ethyleneglycol monoethyl ether, propyleneglycol monomethyl ether, propyleneglycol monomethyl ether acetate, diethyleneglycol dimethyl ether, diethyleneglycol methylethyl ether, 3-methoxy methylpropionate, 3-ethoxy ethylpropionate, N,N-dimethylformamide, acetic acid, and water. The solvent may be used in the form of a single kind of them or may be used in mixture of two or more of them.

Polymerization initiators, which can be used in synthesis of the alkali soluble polymer, include compounds that generate radicals by heat, azo-based initiators such as azo-bis-isobutyronitrile, and peroxide-based initiators such as benzoyl peroxide. An adequate amount of a chain transfer agent, such as thioglycollic acid, may be added to regulate the molecular weight of the alkali soluble polymer.

It is preferable that the alkali soluble polymer have a weight average molecular weight in a range of approximately 1,000 to approximately 100,000 defined by the GPC analysis using polyethylene oxide as a standard. This is because a developing time required for dissolving an exposed portion by an alkali developer is appropriate and the surface of a film hardly gets rough at the time of development. In addition, it is more preferable that the weight average molecular weight is in a range of approximately 1,500 to approximately 50,000 because the developing time for dissolving an unexposed portion by an alkali developer is appropriate, the film surface hardly gets rough at the time of development, and a residue from the development is in an extremely small amount. Further, approximately 2,000 to approximately 20,000 in weight average molecular weight are particularly preferable because of the same reasons.

The weight average molecular weight of the alkali soluble polymer can be measured using polyethylene oxide with a molecular weight of approximately 1,000 to approximately 510,000 (e.g., TSK standard, manufactured by Tosoh Corporation) as a polyethylene oxide standard, Shodex KD-806 M (manufactured by Showa Denko K.K.) as a column, and DMF as a mobile phase.

2 Positive Working Photosensitive Resin Composition of the Invention

The positive working photosensitive resin composition of the invention contains an alkali soluble polymer, which is obtained by copolymerization of a monomer (A) represented by the general formula (I) with another radical polymerizable monomer (B) (the above second alkali soluble polymer); and a photosensitizing agent (C). The alkali soluble polymer in the positive working photosensitive resin composition of the invention may be the aforementioned second alkali soluble polymer or may further contain another alkali soluble polymer so far as it does not impair any effect of the invention.

2-1 Photosensitizing Agent (C)

As the above photosensitizing agent (C), a compound that generates an acid by irradiation with the radiation whose wavelength of 190 to 500 nm may be used. Examples of the photosensitizing agent (C) include an acid generator compound that generates an acid by irradiation with the radiation and a 1,2-quinone diazide compound to be converted into an acid by irradiation with the radiation. In the invention, any of them may be used as a photosensitizing agent (C).

2-1-1 Acid Generator Compound

Examples of the acid generating compound include various types of onium compounds such as ammonium salt, diazonium salt, iodonium salt, sulfonium salt, selenium salt, and arsonium salt; organic halogen compounds such as phenyltrihalo methylsulfonic compounds, halomethyltriazine compounds, and halomethyloxadiazole compounds; sulfonate compounds of nitrobenzylalcohol; sulfonate compounds of oxime; sulfonate compounds of N-hydroxyamide or imide; β-ketonesulfone-based compound; and sulphonic acid generating agents such as sulfonate compounds of benzoin. These compounds may be used alone or in combination of two or more.

Specific examples of the acid generating compound include di(p-tertiarybutylbenzene) diphenyliodonium trifluoromethane sulfonate, diphenyliodonium tetrafluoroborate, diphenyliodonium hexafluorophosphate, diphenyliodonium trifluoromethane sulfonate, benzenediazonium paratoluenesulfonate, 4-p-tolyl-mercapto-2,5-diethoxy-benzendiazonium hexafluorophosphate, diphenylamine-4-diazoniumsulfate, tri(tertiarybutylphenyl)sulfonium trifluoromethane sulfonate, triphenylsulfonium trifluoromethane sulfonate, triphenylselenium tetrafluoroborate, orthonitrobenzyl paratolulene sulfonate, benzointosylate, benzoinmethane sulfonate, benzointrifluoromethane sulfonate, benzoin-2-trifluoro methanebenzene sulfonate, anisointosylate, anisoinmethane sulfonate, anisointrifluoromethane sulfonate, anisoin-2-trifluoro methanebenzene sulfonate, 1-benzoyl-1-methyl sulfonyloxy-cyclohexane, 2-[(p-tolylsulfonyl)oxy]-1-phenyl-1-octanone, 2-[(β-naphthylsulfonyl)oxy]-1-phenyl-1-propanone, 2-[(p-acetamidephenylsulfonyl)oxy]-1-phenyl-1-propanone, amidetosylate benzoate, amidemethanesulfonate benzoate, N-tosyloxyphthalimide, N-[(2-trifluoromethane benzenesulfonyl) oxy]phthalimide, N-tosyloxy-1,8-naphthalimide, N-[(2-trifluoromethane benzene sulfonyl)oxy]-1,8-naphthalimide, N-tosyloxy-2,3-diphenylmaleimide, N-[(2-trifluoromethane benzene sulfonyl)oxy]-2,3-diphenylmaleimide, 4-(di-n-propylamino)-benzoniumtetrafluoro borate, 4-methyl-6-trichloromethyl-2-pyron, 4-(3,4,5-trimethoxy-styryl)-6-trichloromethyl-2-pyron, 4-(4-methoxy-styryl)-6-(3,3,3-trichloro-propenyl)-2-pyron, 2-trichloromethyl-benzimidazol, 2-tribromomethyl-quinone, 2,4-dimethyl-1-tribromoacetyl-benzene, 4-dibromoacetyl-benzoate, 1,4-bis-dibromomethyl-benzene, tris-dibromomethyl-s-triazine, 2-(6-methoxy-napthyl-2-yl)-4,6-bis-trichloromethyl-s-triazine, 2-(napthyl-1-yl)-4,6-bis-trichloro methyl-s-triazine, 2-(napthyl-2-yl)-4,6-bis-trichloromethyl-s-triazine, 2-(4-ethoxy-napthyl-1-yl)4,6-bis-trichloromethyl-s-triazine, 2-(benzopyranyl-3-yl)-4,6-bis-trichloromethyl-s-triazine, 2-(4-methoxy-anthrasi-1-yl)-4,6-bis-trichloromethyl-s-triazine, 2-(phenanthy-9-yl)-4,6-bis trichloromethyl-s-triazine, 2-phenyl-5-trichloromethyl oxadiazole, 2-(p-methoxyphenyl)-5-trichloromethyl oxadiazole, 2-styryl-5-trichloromethyl oxadiazole, 2-(n-butyl)-5-trichloromethyl oxadiazole, α-trifluoroacetphenoneoxime-4-hydroxybenzene sulfonate, 9-(4-hydroxybenzene sulfonyloxyimino)-fluorene, and 9-(4-methacrylamide methylbenzene sulfonyloxyimino)-fluorene. These compounds may be used alone or in combination of two or more.

In particular, in terms of increasing transparency of the positive working photosensitive resin composition, it is preferable to select the acid generator compound from the group of diphenyliodonium tetrafluoroborate, diphenyliodonium hexafluorophosphate, orthonitrobenzyl paratoluene sulphonate, benzoin trifluoromethanesulfonate, N-[(2-trifluoromethane benzensulphonyl)oxy]phthalimide, and N-[(2-trifluoromethane benzensulphonyl)oxy]-2,3-diphenyl maleimide.

In addition, in the positive working photosensitive resin composition of the invention, the content of the acid generator compound is approximately 5 to approximately 50 parts by weight with respect to approximately 100 parts by weight of the alkali soluble polymer.

2-1-2 1,2-Quinone Diazide Compound

In the above 1,2-quinone diazide compound, for example, any compound used as a photosensitizing agent in the field of photo-resist technology can be employed. Examples of the 1,2-quinone diazide compound include an ester of a phenolic compound with 1,2-benzoquinone diazide-4-sulfonic acid or 1,2-benzoquinone diazide-5-sulfonic acid, an ester of a phenolic compound with 1,2-naphthoquinone diazide-4-sulfonic acid or 1,2-naphthoquinone diazide-5-sulfonic acid, an sulfonamide of a compound in which a hydroxyl group of a phenolic compound is replaced by an amino group with 1,2-benzoquinone diazide-4-sulfonic acid or 1,2-benzoquinone diazide-5-sulfonic acid, and an sulfonamide of a compound in which a hydroxyl group of a phenolic compound is replaced by an amino group with 1,2-naphthoquinone diazide-4-sulfonic acid or 1,2-naphthoquinone diazide-5-sulfonic acid. These compounds may be used alone or in combination of two or more. The specific examples of the above phenolic compound will be described below.

2,3,4-trihydroxybenzophenone, 2,4,6-trihydroxybenzophenone, 2,2',4,4'-tetrahydroxy benzophenone, 2,3,3',4-tetrahydroxybenzophenone, 2,3,4,4'-tetrahydroxybenzophenone, bis(2,4-dihydroxy phenyl)methane, bis(p-hydroxyphenyl)methane, tri(p-hydroxyphenyl)methane, 1,1,1-tri(p-hydroxyphenyl) ethane, bis(2,3,4-trihydroxyphenyl) methane, 2,2-bis(2,3,4-trihydroxyphenyl)propane, 1,1,3-tris (2,5-di methyl-4-hydroxyphenyl)-3-phenylpropane, 4,4'-[1-[4-[1-[4-hydroxyphenyl]-1-methylethyl]phenyl] ethylidene] bisphenol, bis(2,5-dimethyl-4-hydroxyphenyl)-2-hydroxyphenylmethane, 3,3,3',3'-tetramethyl-1,1'-spirobiinden-5,6,7,5',6',7'-hexanol, and 2,2,4-trimethyl-7,2',4'-trihydroxyflavan.

In particular, in terms of increasing transparency of the positive working photosensitive resin composition, it is preferable to use the 1,2-quinone diazide compound selected from the group of an ester of 2,3,4-trihydroxybenzophenone with 1,2-naphthoquinone diazide4-sulfonic acid, an ester of 2,3,4-trihydroxybenzophenone with 1,2-naphthoquinone diazide-5-sulfonic acid, an ester of 4,4'-[1-[4-[1-[4-hydroxyphenyl]-1-methylethyl]phenyl]ethylidene]bisphenol with 1,2-naphthoquinone diazide4-sulfonic acid, and an ester of 4,4'-[1-[4-[1-[4-hydroxyphenyl]-1-methylethyl]phenyl] ethylidene]bisphenol with 1,2-naphthoquinone diazide-5-sulfonic acid.

In addition, in the positive working photosensitive resin composition of the invention, the content of the 1,2-quinone diazide compound is approximately 5 to approximately 50 parts by weight with respect to approximately 100 parts by weight of the alkali soluble polymer.

2-2 Solvent

Preferably, the positive working photosensitive resin composition of the invention may further contain a solvent in addition to the alkali soluble polymer and the 1,2-quinone diazide compound. The solvent used in this case is preferably one that dissolves both the alkali soluble polymer and the 1,2-quinone diazide compound.

Further, the solvent used in the invention is preferably at least one compound having a boiling point of approximately 100° C. to approximately 300° C. or a mixture solvent containing such a compound in an amount of approximately 20% by weight or more. Specific examples of the solvent having a boiling point of approximately 100° C. to approximately 300° C. include water, butyl acetate, butyl propionate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetacetate, ethyl acetacetate, methyl 2-oxobutanate, ethyl 2-oxobutanate, dioxane, ethyleneglycol, diethyleneglycol, triethyleneglycol, propyleneglycol, dipropyleneglycol, tripropyleneglycol, 1,4-butanediol, ethyleneglycol monoisopropyl ether, ethyleneglycol monobutyl ether, propyleneglycol monomethyl ether, propyleneglycol monomethyl ether acetate, propyleneglycol monoethyl ether acetate, propyleneglycol monompropyl ether acetate, ethyleneglycol monobutyl ether acetate, cyclohexanone, cyclopentanone, diethyleneglycol monomethyl ether, diethyleneglycol monomethyl ether acetate, diethyleneglycol monoethyl ether, diethyleneglycol monoethyl ether acetate, diethyleneglycol monobutyl ether, diethyleneglycol monobutyl ether acetate, diethyleneglycol dimethyl ether, diethyleneglycol diethyl ether, diethyleneglycol methylethyl ether, toluene, xylene, γ-butyrolactone, and N,N-dimethyl acetamide. As a solvent other than any of the above mixture solvents with the above boiling points of approximately 100 to approximately 300° C., one or two or more of known solvents other than the above solvents can be used.

Among these solvents, as the solvent to be included in the positive working photosensitive resin composition, when at least one selected from the group of propylene glycol monomethyl ether, propylene glycol monomethyl ether acetate, propylene glycol monoethyl ether acetate, methyl 3-methoxypropionate, ethyl 3-etoxypropionate, diethylene glycol monoethyl ether acetate, diethylene glycol monobutyl ether acetate, diethylene glycol dimethyl ether, diethylene glycol methylethyl ether, ethyl lactate, and butyl acetate, is used, it heightens coating uniformity therefore it is preferable. Further, when at least one solvent is selected from the group consisting of propylene glycol monomethyl ether acetate, methyl 3-methoxypropionate, ethyl 3-ethoxypropionate, diethylene glycol methylethyl ether, ethyl lactate, and butyl acetate, it is further preferable in terms of higher coating uniformity of the positive working photosensitive resin composition and the safety of the human body.

Further, the solvent is preferably added to the positive working photosensitive resin composition of the invention so that the total amount of a solid fraction (i.e., the alkali soluble polymer and the photosensitizing agent) will be approximately 5 to approximately 50% by weight with respect to the sum of the amounts of the alkali soluble polymer, the photosensitizing agent, and the solvent.

2-3 Other Components
2-3-1 Additive

Various kinds of additives may be added to the positive working photosensitive resin composition of the invention to improve the resolution, coating uniformity, developing property, and adhesiveness thereof. The additives include: an acryl, styrene, polyethylene imine, or urethane-based macromolecule dispersant; an anionic, cationic, nonionic, or fluorine-based surfactant; a silicon resin-based spreadability improver; an adhesiveness improver such as a silane-coupling agent; a UV absorber such as alkoxybenzophenones; a cohesion inhibitor such as sodium polyacrylate; a thermal crosslinking agent such as an epoxy compound, a melamine compound, or a bis-azide compound; and an alkali-solubility accelerator such as organic carboxylic acid.

Specific examples of the additives include Polyflow No. 45, Polyflow-KL-245, Polyflow No. 75, Polyflow No. 90, and Polyflow No. 95 (all of which are trademarks that are manufactured by Kyoeisha Chemical Co., Ltd.); Disperbyk 161, Disperbyk 162, Disperbyk 163, Disperbyk 164, Disperbyk 166, Disperbyk 170, Disperbyk 180, Disperbyk 181, Disperbyk 182, BYK300, BYK306, BYK310, BYK320, BYK330, BYK344, and BYK346 (all of which are trademarks that are manufactured by BYK-Chemic Japan K.K.); KP-341, KP-358, KP-368, KF-96-50CS, and KF-50-100CS (all of which are trademarks that are manufactured by Shin-Etsu Chemical Co., Ltd.); Surflon SC-101 and Surflon KH-40 (both of which are trademarks that are manufactured by Seimi Chemical Co., Ltd.); Ftergent 222F, Ftergent 251, and FTX-218 (all of which are trademarks that are manufactured by Neos Co., Ltd.); EFTOP EF-351, EFTOP EF-352, EFTOP EF-601, EFTOP EF-801, and EFTOP EF-802 (each of which are trademarks that are manufactured by Mitsubishi Materials Corporation); Megaface F-171, Megaface F-177, Megaface F-475, Megaface R-08, and Megaface R-30 (all of which are trademarks that are manufactured by Dainippon Ink and Chemicals Incorporated); fluoroalkyl benzenesulfonate, fluoroalkyl carboxylate, fluoroalkyl polyoxyethylene ether, fluoroalkyl ammonium iodide, fluoroalkyl betaine, fluoroalkyl sulfonate, diglycerin tetrakis(fluoroalkyl polyoxy ethylene ether), fluoroalkyl trimethylammonium salt, fluoroalkyl amino sulfonate, polyoxyethylene nonylphenylether, polyoxyethylene octylphenylether, polyoxyethylene alkylether, polyoxyethylene laurylether, polyoxyethylene oleylether, polyoxyethylene tridecylether, polyoxyethylene cetylether, polyoxyethylene stearylether, polyoxyethylene laurate, polyoxyethylene olerate, polyoxyethylene stearate, polyoxyethylene laurylamine, sorbitan laurate, sorbitan palmitate, sorbitan stearate, sorbitan oleate, sorbitan fatty ester, polyoxyethylene sorbitan laurate, polyoxyethylene sorbitan palmitate, polyoxyethylene sorbitan stearate, polyoxyethylene sorbitan oleate, polyoxyethylene naphtylether, alkylbenzene sulfonate salt, and alkyldiphenylether disulfonate. At least one of those may preferably be chosen to be used in the above-mentioned additive.

Among these additives, the addition of at least one selected from fluorine-based surfactants such as fluoroalkyl benzene sulfonate, fluoroalkyl carboxylate, fluoroalkyl polyoxyethylene ether, fluoroalkyl ammonium iodide, fluoroalkyl betaine, fluoroalkyl sulfonate, diglycerin tetrakis(fluoroalkyl polyoxyethylene ether), fluoroalkyl trimethyl ammonium salt, and fluoroakyl aminosulfonate; and silicon-resin spreadability improvers such as BYK306, BYK344, BYK346, KP-341, KP-358, and KP-368, is preferable in terms of an increase in coating uniformity of a positive working photosensitive composition.

2-3-2 Other Polymers

Any of other polymers other than the aforementioned alkali soluble polymer may be added to the positive working photosensitive resin composition of the invention to improve thermal resistance, chemical resistance, and the like thereof. The polymers to be added are preferably an oxiranyl group-containing polymer without any carboxyl group or an oxetanyl group-containing polymer without any carboxyl group.

Specific examples of an oxiranyl group-containing polymer without any carboxyl group or the oxetanyl group-containing polymer without any carboxyl group include a homopolymer of glycidyl methacrylate; a copolymer of glycidyl methacrylate with another radical-polymerizable monofunctional monomer; a homopolymer of 3-ethyl-3-methacryloxy methyloxetane; and a copolymer of 3-ethyl-3-methacryloxy methyloxetane with another radical-polymerizable monofunctional monomer. The addition of any of these polymers to the positive working photosensitive resin composition of the invention is preferable in terms of further improvements of thermal resistance, chemical resistance, developing property, and the like.

In particular, the addition of a homopolymer of glycidyl methacrylate, a copolymer of glycidylmethacrylate with methylmethacrylate, a homopolymer of 3-ethyl-3-methacryloxy methyloxetane, a copolymer of glycidyl methacrylate with N-phenyl maleimide, and a copolymer of glycidyl methacrylate with 3-ethyl-3-methacryloxy methyloxetane to the positive working photosensitive resin composition of the invention is more preferable because of further improvements in thermal resistance, chemical resistance, and developing property.

Further, so far as the thermal resistance and the chemical resistance of the composition are not decreased, the composition may be added with a small amount of the oxiranyl group-containing polymer with carboxyl group or the oxetanyl group-containing polymer with carboxyl group can be mixed. Examples of such polymers include a glycidyl methacrylate/metacrylic acid copolymer as described in JP 4-198937 A, a homopolymer of metacrylic acid, or a copolymer of glycidyl methacrylate with monomethacryloyloxyethyl hexahydrophthalate, but not particularly limited so far as each of them has an oxiranyl group or oxetanyl group and a carboxyl group.

Specific examples of a radical polymerizable monomer having a carboxyl group, which can be used as a raw material for these polymers, include (meth)acrylic acid, crotonic acid, α-chloracrylic acid, cinnamic acid, maleic acid, fumaric acid, itaconic acid, citraconic acid, mesaconic acid, ω-carboxypoly caprolactonemono(meth)acrylate, mono[2-(meth)acryloyloxyethyl] succinate, mono[2-(meth) acryloyloxyethyl] maleate, and mono[2-(meth)acryloyloxyethyl]cyclohexene-3,4-di carboxylate.

Further, as the specific examples of the radical polymerizable monomer having an oxiranyl group, which can be used as a raw material for these polymers, include glycidyl(meth)acrylate, methyl glycidyl (meth)acrylate, α-ethyl acrylic acid glycidyl ester, and 3,4-epoxycyclohexyl (meth)acrylate. Further, as the specific examples of the radical polymerizable monomer having an oxetanyl group, which can be used as a raw material for these polymers, include (3-ethyl-3-oxetanyl) methyl (meth)acrylate and (2-ethyl-2-oxetanyl)methyl (meth)acrylate. These radical polymerizable monomers each having a carboxyl group and an oxiranyl or oxetanyl group may be used in the form of a single kind of monomer or may be used in combination of two or more kinds of monomers.

2-3-3 Polycarboxylic Acid

The positive working photosensitive resin composition of the invention may be added with polycarboxylic acid such as trimellitic anhydride, phthalic anhydride, or 4-methyl cyclohexane-1,2-dicarboxylic acid anhydride. Among these polycarboxylic acids, trimellitic anhydride is preferable.

When the above polycarboxylic acid is added to the positive working photosensitive resin composition of the invention and then heated, the carboxyl group of the polycarboxylic acid can react with the oxiranyl or oxetanyl group of the positive working photosensitive resin composition if the oxiranyl or oxetanyl group is present therein to improve the thermal resistance and chemical resistance thereof. In addition, when the above polycarboxylic acid is added to the positive working photosensitive resin composition of the invention, the 1,2-quinone diazide compound can be prevented from being decomposed and then the positive working photosensitive resin composition can be prevented from being colored during storage.

If the polycarboxylic acid is added to the positive working photosensitive resin composition of the invention, the content of the polycarboxylic acid is preferably approximately 1 to approximately 30 parts by weight, more preferably approximately 2 to approximately 20 parts by weight with respect to approximately 100 parts by weight of the alkali solution polymer.

2-4 Storage of Positive Working Photosensitive Resin Composition

When the positive working photosensitive resin composition of the invention is protected from light and stored at a temperature of approximately −30° C. to approximately 25° C., it is preferable, because the composition shows good temporal stability. When the storage temperature is in the range of approximately −20° C. to approximately 10° C., it is more preferable because no precipitated product appears.

3 Resin Film made of the Positive Working Photosensitive Resin Composition of the Invention The photosensitive resin composition of the invention is suitable to form a transparent resin film and has a comparatively high resolution at the time of patterning, so that it is optimum for the formation of an insulating film with a small pore with approximately 10 μm or less in pore size. Here, the term "insulating film" refers to, for example, a film (interlayer insulator) provided for insulating between the wirings arranged in layers.

The resin films of the above transparent film, the insulating film, and the like can be formed by the conventional method, which is used in the formation of a resin film in the field of photo-resist technology. For instance, it can be formed as follows.

First, the positive working photosensitive resin composition of the invention is applied on a substrate made of glass or the like by the conventionally known method such as a spin-coating method, a roll-coating method, or a slit-coating method. Examples of the substrate include: transparent glass substrates such as a white glass plate, a blue glass plate, a silica-coated blue glass plate; synthetic resin sheets, films, or substrates, such as those made of polycarbonate, polyether sulfone, polyester, acrylic resin, vinyl chloride resin, aromatic polyamide resin, polyamide imide, and polyimide; metal substrates such as an aluminum plate, a copper plate, a nickel plate, and a stainless steel plate; ceramic plates; and semiconductor substrates having photoelectric conversion elements. These substrates may be subjected to any pretreatment such as a chemical treatment with a silane coupling agent or the like, a plasma treatment, an ion-plating, a sputtering, a chemical vapor deposition, and a vacuum deposition.

Subsequently, the applied film of the positive working photosensitive resin composition on the substrate is dried by a hot plate or an oven. In general, it is dried at 60 to 120° C. for 1 to 5 minutes. The dried film on the substrate is irradiated with a radiation such as UV-ray or the like through a mask with a desired pattern form. The irradiation conditions may depend on the kind of the photosensitizing agent in the positive working photosensitive resin composition. For instance, when the photosensitizing agent is a 1,2-quinone diazide compound, the irradiation is suitably carried out by i-ray at 5 to 1,000 mJ/cm$^2$. The 1,2-quinone diazide compound located on the UV-irradiated portion is converted into indene carboxylic acid and to be in a state of being quickly dissolved in a developing solution.

The post-radiation film may be developed using a developing solution such as an alkali solution. The development allows the irradiated portion of the film to be quickly dissolved in the developing solution. A developing method may be, but not particularly limited to, a dip-development, a paddle-development, or a shower-development.

The above developing solution is preferably an alkali solution. Specific example of alkali in the alkali solution include tetra-methyl ammonium hydroxide, tetra-ethyl ammonium hydroxide, 2-hydroxy ethyl trimethyl ammonium hydroxide, sodium carbonate, sodium hydrogen carbonate, potassium carbonate, potassium hydrogen carbonate, sodium hydroxide, and potassium hydroxide. In addition, as a developing solution, any of these aqueous alkali solutions is suitably used. In other words, examples of the developing solutions include: aqueous organic alkali solutions such as those of tetra-methyl ammonium hydroxide, tetra-ethyl ammonium hydroxide, and 2-hydroxyethyl trimethyl ammonium hydroxide; and aqueous inorganic alkali solutions such as those of sodium carbonate, sodium hydroxide, and potassium hydroxide.

The developing solution may be added with methanol, ethanol, or a surfactant for a reduction in developing residue and a suitable pattern formation. For instance, the surfactant may be one selected from the group consisting of anionic, cationic, and nonionic surfactants. Among them, in particular, a polyoxyethylene alkyl ether, which is a nonionic surfactant, is preferably added in terms of an increase in resolution.

The film subjected to the development is washed with pure water well and the whole surface of the film on the substrate is then irradiated again with a certain radiation. For instance, when the radiation is UV-ray, the irradiation thereof at a strength of approximately 100 to approximately 1,000 mJ/cm$^2$ is carried out. The film on the substrate, which has been irradiated again with the radiation, is finally baked at approximately 180 to approximately 250° C. for approximately 10 to approximately 120 minutes. Consequently, the transparent film with the desired pattern can be obtained.

The patterned transparent film thus obtained may be also used as a patterned insulating film. The hole formed in the insulating film is preferably in the shape of a square, a rectangle, a circle, or an oval when viewed directly from above. Further, a transparent electrode may be formed on the insulating film and the patterning may be then performed by etching, followed by the formation of a film to be subjected to orientation-processing. The insulating film has a high sputtering resistance, so that the appearance of wrinkles does not occur on the insulating film even after forming the transparent electrode and high transparency can be thus retained.

4 Display Device Including the Aforementioned Resin Film

The aforementioned resin films such as the transparent film and the insulating film, can be employed in display devices using liquid crystals and the like. For instance, the display device can be produced such that a device substrate on which a transparent film or an insulating film being patterned on the substrate as described above and a color filter substrate provided as an opposite substrate are aligned and pressure-bonded, followed by subjecting to a thermal treatment and combining together. Subsequently, a liquid crystal is injected into the space between the opposite substrates, followed by sealing an inlet to thereby produce the display device.

Alternatively, the display device may be one produced by layering the device substrates together after dispersing the liquid crystal on the device substrate and then sealing them to prevent the leakage of the liquid crystal.

Consequently, the insulating film having an excellent transparency, which is formed of the positive working photosensitive resin composition of the invention, can be employed in the liquid crystal display device.

In addition, the liquid crystal used in the liquid crystal display device of the invention (i.e., the liquid crystal compound and the liquid crystal composition) may be, but not particularly limited to, any of liquid crystal compound and a liquid crystal composition.

The positive working photosensitive resin composition in accordance with a preferred embodiment of the invention has various properties such as high solvent resistance, high water resistance, high acid resistance, high alkali resistance, high thermal resistance, high transparency, and adhesiveness with a substrate, which are generally required for polymer compositions.

Further, in a preferred embodiment of the invention, a positive working photosensitive resin composition can be provided without using a radical polymerizable monomer having a carboxyl group.

Further, because the positive working photosensitive resin composition in accordance with the preferred embodiment of the invention is excellent in solvent resistance, acid resistance, alkali resistance, thermal resistance, and transparency, a transparent film, an insulating film, a display device, or the like prepared using the positive working photosensitive resin composition hardly causes a rough surface on a resin film even after: immersion, contact with a solvent, acid, or alkali solution or the like; or thermal treatment; or the like. As a result, the transparent film or the like prepared using the positive working photosensitive resin composition in accordance with the preferred embodiment of the invention shows an increase in optical transmittance and improves the display quality of a product, such as a display device, prepared using such a transparent film or the like.

It will be apparent to those skilled in the art that various modifications and variations can be made in the invention and specific examples provided herein without departing from the spirit or scope of the invention. Thus, it is intended that the invention covers the modifications and variations of this invention that come within the scope of any claims and their equivalents.

The following examples are for illustrative purposes only and are not intended, nor should they be interpreted to, limit the scope of the invention.

EXAMPLES

Hereinafter, the invention will be further described with reference to Examples. However, the invention will not be limited to these examples.

Synthetic Example 1

Synthesis of Alkali Soluble Polymer (1)

In a four-necked flask with a stirrer, 4-hydroxyphenyl vinyl ketone as monomer A, glycidyl acrylate as monomer b1, (3-ethyl-3-oxetanyl)methylacrylate as monomer b2, and benzyl methacrylate as monomer b5 were loaded in amounts described below and then thermally polymerized with one another at the reflux temperature of 2-butanone for 4 hours. A polymerization initiator used was 2,2'-azobis-(2,4-dimethyl valeronitrile).

| | |
|---|---|
| 2-butanone | 200.0 g |
| 4-hydroxyphenyl vinyl ketone | 25.0 g |
| Glycidyl acrylate | 30.0 g |
| (3-ethyl-3-oxetanyl) methylacrylate | 20.0 g |
| Benzyl methacrylate | 25.0 g |
| 2,2'-azobis (2,4-dimethyl valeronitrile) | 2.0 g |

The reaction solution was cooled to room temperature and then added to a large amount of hexane. The resulting precipitate was dissolved in methyl 3-methoxypropionate (hereinafter, referred to as "MMP") and then the polymerization solvent, hexane, was distilled off at 100° C. under reduced pressure of $1.33 \times 10^4$ Pa, thereby obtaining a MMP solution of alkali soluble polymer (1).

A part of the solution was sampled and the volume of the sample was dried at 220° C. for 30 minutes, followed by measuring the weight of the sample reduced by the drying. A yield was then measured using the resulting weight value as the weight of a polymer. Further, based on this value, a solution was prepared by addition of MMP so that the concentration of the polymer becomes 30% by weight, followed by measuring the weight average molecular weight thereof by the GPC analysis (polyethylene oxide standard). As a result, the yield of the resulting alkali solution polymer (1) was 78%. In addition, the alkali soluble polymer (1) thus obtained had a weight average molecular weight of 5,800 as defined by the GPC analysis (polyethylene oxide standard).

Synthetic Example 2

Synthesis of Alkali Soluble Polymer (2)

Polymerization was carried out in a manner similar to Synthetic Example 1, except that glycidyl methacrylate as monomer b1, (3-ethyl-3-oxetanyl)methyl methacrylate as monomer b2, and styrene as monomer b5 were used and loaded in amounts as described below.

| | |
|---|---|
| 2-butanone | 200.0 g |
| 4-hydroxyphenyl vinyl ketone | 20.0 g |
| Glycidyl methacrylate | 30.0 g |
| (3-ethyl-3-oxetanyl)methyl methacrylate | 15.0 g |
| Styrene | 35.0 g |
| 2,2'-azobis (2,4-dimethyl valeronitrile) | 2.0 g |

Processing was carried out in a manner as that of Synthetic Example 1 and 30% by weight of alkali soluble polymer (2) in MMP solution was obtained. The yield of polymer was 75%. The resulting alkali soluble polymer (2) had a weight average molecular weight of 5,200 obtained by the GPC analysis (polyethylene oxide standard).

Synthetic Example 3

Synthesis of Alkali Soluble Polymer (3)

Polymerization was carried out in a manner similar to Synthetic Example 1, except that methyl glycidyl methacrylate as monomer b1, (2-ethyl-2-oxetanyl)methyl methacrylate as monomer b2, and N-phenyl maleimide as monomer b3 were used and loaded in amounts as described below.

| | |
|---|---|
| 2-butanone | 200.0 g |
| 4-hydroxyphenyl vinyl ketone | 30.0 g |
| Methyl Glycidyl methacrylate | 20.0 g |
| (2-ethyl-2-oxetanyl)methyl methacrylate | 20.0 g |
| N-phenyl maleimide | 30.0 g |
| 2,2'-azobis (2,4-dimethyl valeronitrile) | 2.0 g |

Processing was carried out in a manner as that of Synthetic Example 1 and 30% by weight of alkali soluble polymer (3) in MMP solution was obtained. The yield of polymer was 82%. The resulting alkali soluble polymer (3) had a weight average molecular weight of 5,000 obtained by the GPC analysis (polyethylene oxide standard).

Synthetic Example 4

Synthesis of Alkali Soluble Polymer (4)

Polymerization was carried out in a manner similar to Synthetic Example 1, except that glycidyl methacrylate as monomer b1, (2-ethyl-2-oxetanyl)methyl methacrylate as monomer b2, and tricycle $[5.2.1.0^{2,6}]$decanyl methacrylate as monomer b4 were used and loaded in amounts as described below.

| | |
|---|---|
| 2-butanone | 200.0 g |
| 4-hydroxyphenyl vinyl ketone | 30.0 g |
| Glycidyl methacrylate | 30.0 g |
| (2-ethyl-2-oxetanyl)methyl methacrylate | 15.0 g |
| tricyclo$[5.2.1.0^{2,6}]$decanyl methacrylate | 25.0 g |
| 2,2'-azobis (2,4-dimethyl valeronitrile) | 2.0 g |

Processing was carried out in a manner as that of Synthetic Example 1 and 30% by weight of alkali soluble polymer (4) in MMP solution was obtained. The yield of polymer was 68%. The resulting alkali soluble polymer (4) had a weight average molecular weight of 5,100 obtained by the GPC analysis (polyethylene oxide standard).

Synthetic Example 5

Synthesis of Alkali Soluble Polymer (5)

Polymerization was carried out in a manner similar to Synthetic Example 1, except that glycidyl methacrylate as monomer b1, N-cyclohexyl maleimide as monomer b3, and tricycle $[5.2.1.0^{2,6}]$decanyl methacrylate as monomer b4 were used and loaded in amounts as described below.

| | |
|---|---|
| 2-butanone | 200.0 g |
| 4-hydroxyphenyl vinyl ketone | 40.0 g |
| Glycidyl methacrylate | 40.0 g |
| N-cyclohexyl maleimide | 10.0 g |

| | |
|---|---|
| tricyclo[5.2.1.0$^{2,6}$]decanyl methacrylate | 10.0 g |
| 2,2'-azobis (2,4-dimethyl valeronitrile) | 2.0 g |

Processing was carried out in a manner as that of Synthetic Example 1 and 30% by weight of alkali soluble polymer (5) in MMP solution was obtained. The yield of polymer was 75%. The resulting alkali soluble polymer (5) had a weight average molecular weight of 4,700 obtained by the GPC analysis (polyethylene oxide standard).

Synthetic Example 6

Synthesis of Alkali Soluble Polymer (6)

Employing the same apparatus as that of Synthetic Example 1, polymerization was carried out using the composition described below and using 2-butanone as a solvent, while heating at 70° C. for 0.5 hours.

| | |
|---|---|
| 2-butanone | 200.0 g |
| 4-hydroxyphenyl vinyl ketone | 15.0 g |
| Glycidyl methacrylate | 85.0 g |
| 2,2'-azobis (2,4-dimethyl valeronitrile) | 4.0 g |

Processing was carried out in a manner as that of Synthetic Example 1 and 30% by weight of alkali soluble polymer (6) in MMP solution was obtained. The yield of polymer was 85%. The resulting alkali soluble polymer (5) had a weight average molecular weight of 8,900 obtained by the GPC analysis (polyethylene oxide standard).

Synthetic Example 7

Synthesis of Alkali Soluble Polymer (7)

Polymerization was carried out in a manner similar to Synthetic Example 1, except that glycidyl methacrylate as monomer b1, and tricyclo[5.2.1.0$^{2,6}$]decanyl methacrylate as monomer b4 was used and loaded in amounts as described below.

| | |
|---|---|
| 2-butanone | 200.0 g |
| 4-hydroxyphenyl vinyl ketone | 30.0 g |
| Glycidyl methacrylate | 45.0 g |
| tricyclo[5.2.1.0$^{2,6}$]decanyl methacrylate | 25.0 g |
| 2,2'-azobis (2,4-dimethyl valeronitrile) | 2.0 g |

Processing was carried out in a manner as that of Synthetic Example 1 and 30% by weight of alkali soluble polymer (7) in MMP solution was obtained. The yield of polymer was 72%. The resulting alkali soluble polymer (7) had a weight average molecular weight of 4,600 obtained by the GPC analysis (polyethylene oxide standard).

Comparative Synthetic Example 1

Synthesis of Comparative Copolymer (1)

Polymerization was carried out in a manner similar to Synthetic Example 1, and the following components in weights as described below were loaded.

| | |
|---|---|
| 2-butanone | 200.0 g |
| Acrylic acid | 15.0 g |
| Glycidyl acrylate | 30.0 g |
| (3-ethyl-3-oxetanyl)methyl acrylate | 20.0 g |
| Benzyl methacrylate | 35.0 g |
| 2,2'-azobis (2,4-dimethyl valeronitrile) | 2.0 g |

Processing was carried out in a manner as that of Synthetic Example 1 and 30% by weight of comparative copolymer (1) in MMP solution was obtained. The yield of polymer was 72%. The resulting comparative copolymer (1) had a weight average molecular weight of 6,200 obtained by the GPC analysis (polyethylene oxide standard).

Comparative Synthetic Example 2

Synthesis of Comparative Copolymer (2)

Polymerization was carried out in a manner similar to Synthetic Example 1, and the following components in weights as described below were loaded.

| | |
|---|---|
| 2-butanone | 200.0 g |
| Methacrylic acid | 18.0 g |
| Glycidyl methacrylate | 30.0 g |
| (3-ethyl-3-oxetanyl)methyl acrylate | 20.0 g |
| N-phenyl maleimide | 32.0 g |
| 2,2'-azobis (2,4-dimethyl valeronitrile) | 2.0 g |

Processing was carried out in a manner as that of Synthetic Example 1 and 30% by weight of comparative copolymer (2) in MMP solution was obtained. The yield of polymer was 83%. The resulting comparative copolymer (2) had a weight average molecular weight of 7,900 obtained by the GPC analysis (polyethylene oxide standard).

Comparative Synthetic Example 3

Synthesis of Comparative Copolymer (3)

Polymerization was carried out in a manner similar to Synthetic Example 1, and the following components in weights as described below were loaded.

| | |
|---|---|
| 2-butanone | 200.0 g |
| Methacrylic acid | 10.0 g |
| Glycidyl methacrylate | 90.0 g |
| 2,2'-azobis (2,4-dimethyl valeronitrile) | 4.0 g |

Processing was carried out in a manner as that of Synthetic Example 6 and 30% by weight of comparative copolymer (3) in MMP solution was obtained. The yield of polymer was 85%. The resulting comparative copolymer (3) had a weight average molecular weight of 9,600 obtained by the GPC analysis (polyethylene oxide standard).

Example 1

Production of Positive Working Photosensitive Resin Composition

A positive working photosensitive resin composition was prepared by mixing and dissolving: the alkali soluble polymer (1) obtained in Synthetic Example 1; a condensed product of 4,4'-[1-[4-[1-[4-hydroxyphenyl]-1-methylethyl]phenyl] ethylidene]bisphenol and 1,2-naphthoquinone diazide-5-sulfonyl chloride (an average esterification rate of 58%, hereinafter referred to as "PAD"); a fluorine-based surfactant, Megaface R-08, manufactured by Dai-Nippon Ink Chemicals (hereinafter, abbreviated as "R-08") as an additive; and MMP as a solvent in weights as described below.

| | |
|---|---|
| MMP | 1.40 g |
| 30% by weight of alkali soluble polymer (1) in solution | 10.00 g |
| PAD | 0.60 g |
| R-08 | 0.006 g |

Method of Evaluating Positive Working Photosensitive Resin Composition (1) Formation of Patterned Transparent Film The positive working photosensitive resin composition synthesized in Example 1 was spin-coated on a glass substrate at 800 rpm for 10 seconds and then dried on a hot plate at 100° C. for 2 minutes. The substrate was exposed with an exposure gap of 100 μm through a mask for hole-pattern formation in the air using the Proximity Exposure System TME-150 PRC, manufactured by Topcon Co., Ltd. with g, h, and i rays taken out by cutting rays of 350 nm or less through a wavelength cut filter. The amount of light exposure was measured using a totalizing actinometer UIT-102 and a photometer UVD-365 PD, manufactured by Ushio Inc., resulting in 150 mJ/cm². The glass substrate after the exposure was developed by dipping in an aqueous solution of tetramethyl ammonium hydroxide for 60 seconds, thereby removing a resin composition from the exposed portion. The substrate after the development was washed with pure water for 60 seconds and then dried on a hot plate at 100° C. for 2 minutes. The whole surface of the substrate was exposed in the exposure system at a light exposure of 300 mJ/cm² without using any mask and then post-baked in an oven at 230° C. for 30 minutes, thereby forming a patterned transparent film with a film thickness of 3 μm. The film thickness was measured as an average of film thicknesses measured at three different points using a probe-type thickness tester α-Step 200, manufactured by KLA-Tencor Japan Co., Ltd.

(2) Residual Film Rate after Development

Film thicknesses before and after the development were measured and residual film rate after development was calculated from the following equation: Film thickness after development/film thickness before development)×100 (%).

(3) Resolution

The substrate of the patterned transparent film after post-baking obtained in the above (1) was observed by an optical microscope at a magnification of 400 times to confirm a mask size where the glass is exposed on the bottom of the hole pattern.

(4) Transparency

TC-1800 (manufactured by Tokyo Denshoku Co. Ltd.) was used for the measurement of an optical transmittance at a wavelength of 400 nm as a reference on a glass substrate without forming a transparent film.

(5) Solvent Resistance

The patterned transparent film obtained in the above (1) was dipped in N-methyl-2-pyrolidone at 100° C. for 5 minutes and the change of a film thickness was measured. The film thicknesses were measured before and after the dipping and the percentage change of a film thickness was calculated from the following equation: Film thickness after dipping/film thickness before dipping)×100 (%).

When the percentage change of the film thickness is −2 to 2%, it is judged good. When it exceeds 2% by swelling or is less than −2% by dissolving, it is judged no good.

(6) Acid Resistance

The patterned transparent film obtained in the above (1) was dipped in hydrochloric acid/nitric acid/water=4/2/4 (weight ratio) at 50° C. for 3 minutes and the change of a film thickness was measured. The film thicknesses were measured before and after the dipping and the percentage change of a film thickness was calculated from the following equation: Film thickness after dipping/film thickness before dipping)×100 (%).

When the percentage change of the film thickness is −2 to 2%, it is judged good. When it exceeds 2% by swelling or is less than −2% by dissolving, it is judged no good.

(7) Alkali Resistance

The patterned transparent film obtained in the above (1) was dipped in 5% potassium hydroxide solution at 60° C. for 10 minutes and the change of a film thickness was measured. The film thicknesses were measured before and after the dipping and the percentage change of a film thickness was calculated from the following equation: Film thickness after dipping/film thickness before dipping)×100 (%).

When the percentage change of the film thickness is −2 to 2%, it is judged good. When it exceeds 2% by swelling or is less than −2% by dissolving, it is judged no good.

(8) Thermal Resistance

The substrate of the patterned transparent film obtained in the above (1) was further baked in the oven at 230° C. for 1 hour and the optical transmittance thereof was then measured in a manner similar to the above (4) before and after the heating. The optical transmittance after the post-baking (before the additional baking) was defined as $T_1$ and the optical transmittance after the additional baking was defined as $T_2$. The less a fall of the optical transmittance after the additional baking from the optical transmittance after the post baking is, it can be judged more excellent. In addition, the film thicknesses were measured after and before the heating. Then, the percentage change of the film thickness was calculated from the following equation: Film thickness after additional baking/film thickness after post baking)×100 (%).

(9) Adhesiveness

The patterned transparent film obtained in the above (1) was evaluated by a crosscut peeling test (crosscut test). The results of the evaluation were expressed by the number of the remaining grids after tape-peeling among 100 grids (1 mm square).

(10) Sputtering Resistance

On the substrate of the patterned transparent film obtained in the above (1), a transparent electrode made of indium tin oxide (ITO) was formed in a film thickness of 150 nm by sputtering at 200° C. After that, the temperature was returned to room temperature and the presence or absence of a wrinkle on the film surface was observed by visual observation. The sputtering resistance was judged good (G) when no wrinkle was formed on the film surface. On the other hand, it was judged no good (NG) when a wrinkle was formed on the film surface.

With respect to the positive working photosensitive resin composition synthesized in Example 1, the results obtained by the aforementioned evaluation method are listed in Table 1.

TABLE 1

|  | Example 1 | Example 2 | Example 3 | Example 4 | Example 5 | Example 6 | Example 7 |
|---|---|---|---|---|---|---|---|
| Residual film rate after development (%) | 94.9 | 95.3 | 95.0 | 94.9 | 94.8 | 94.2 | 94.1 |
| Resolution (μm) | 7 | 8 | 8 | 7 | 7 | 7 | 7 |
| Film thickness after post baking (μm) | 2.98 | 3.01 | 2.96 | 3.05 | 3.00 | 3.02 | 3.04 |
| Optical transmittance $T_1$ (%) | 97.0 | 97.3 | 96.8 | 97.4 | 97.8 | 98.0 | 97.0 |
| Solvent resistance | 99.7 | 100.2 | 100.5 | 100.2 | 99.9 | 100.0 | 100.2 |
| Acid resistance | 100.8 | 100.5 | 100.7 | 100.8 | 100.3 | 100.3 | 100.5 |
| Alkali resistance | 101.2 | 101.0 | 101.3 | 100.8 | 100.9 | 100.7 | 101.2 |
| Optical transmittance $T_2$ (%) | 96.1 | 96.3 | 95.8 | 96.8 | 97.3 | 97.7 | 96.0 |
| Film thickness after additional baking (μm) | 2.92 | 2.97 | 2.91 | 3.01 | 2.97 | 3.00 | 3.01 |
| Thermal resistance (percentage change of film thickness, %) | 97.7 | 98.7 | 98.3 | 98.7 | 99.0 | 99.3 | 99.0 |
| Adhesiveness | 100 | 100 | 100 | 100 | 100 | 100 | 100 |
| Sputtering resistance | G | G | G | G | G | G | G |

Example 2

A positive working photosensitive resin composition was prepared in a manner similar to Example 1, except that the alkali soluble polymer (2) obtained in Synthetic Example 2 was used instead of the alkali soluble polymer (1) used in Example 1, and evaluated. The result is shown in Table 1.

Example 3

A positive working photosensitive resin composition was prepared in a manner similar to Example 1, except that the alkali soluble polymer (3) obtained in Synthetic Example 3 was used instead of the alkali soluble polymer (1) used in Example 1, and evaluated. The result is shown in Table 1.

Example 4

A positive working photosensitive resin composition was prepared in a manner similar to Example 1, except that the alkali soluble polymer (4) obtained in Synthetic Example 4 was used instead of the alkali soluble polymer (1) used in Example 1, and evaluated. The result is shown in Table 1.

Example 5

A positive working photosensitive resin composition was prepared in a manner similar to Example 1, except that the alkali soluble polymer (5) obtained in Synthetic Example 5 was used instead of the alkali soluble polymer (1) used in Example 1, and evaluated. The result is shown in Table 1.

Example 6

A positive working photosensitive resin composition was prepared in a manner similar to Example 1, except that the alkali soluble polymer (6) obtained in Synthetic Example 6 was used instead of the alkali soluble polymer (1) used in Example 1, and evaluated. The result is shown in Table 1.

Example 7

A positive working photosensitive resin composition was prepared in a manner similar to Example 1, except that the alkali soluble polymer (7) obtained in Synthetic Example 7 was used instead of the alkali soluble polymer (1) used in Example 1, and evaluated. The result is shown in Table 1.

Comparative Example 1

A positive working photosensitive resin composition was prepared in a manner similar to Example 1, except that the comparative copolymer (1) obtained in Comparative Synthetic Example 1 was used instead of the alkali soluble polymer (1) used in Example 1, and evaluated. The result is shown in Table 2.

TABLE 2

|  | Comparative Example 1 | Comparative Example 2 | Comparative Example 3 |
|---|---|---|---|
| Residual film rate after development (%) | 92.1 | 91.5 | 93.7 |
| Resolution (μm) | 7 | 8 | 7 |
| Film thickness after post baking (μm) | 3.01 | 2.97 | 3.03 |
| Optical transmittance $T_1$ (%) | 93.8 | 92.8 | 95.8 |
| Solvent resistance | 99.5 | 99.8 | 100.5 |
| Acid resistance | 100.9 | 100.8 | 101.2 |
| Alkali resistance | 101.2 | 101.6 | 101.4 |
| Optical transmittance $T_2$ (%) | 90.6 | 89.4 | 94.2 |
| Film thickness after additional baking (μm) | 2.89 | 2.85 | 2.94 |
| Thermal resistance (percentage change of film thickness, %) | 96.0 | 96.0 | 97.0 |
| Adhesiveness | 100 | 100 | 100 |
| Sputtering resistance | G | G | G |

Comparative Example 2

A positive working photosensitive resin composition was prepared in a manner similar to Example 1, except that the comparative copolymer (2) obtained in Comparative Synthetic Example 2 was used instead of the alkali soluble polymer (1) used in Example 1, and evaluated. The result is shown in Table 2.

Comparative Example 3

A positive working photosensitive resin composition was prepared in a manner similar to Example 1, except that the comparative copolymer (3) obtained in Comparative Synthetic Example 3 was used instead of the alkali soluble polymer (1) used in Example 1, and evaluated. The result is shown in Table 2.

The positive working photosensitive resin composition of the invention can be used, for example, in the process for producing a liquid crystal display device.

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

What is claimed is:

1. An alkali soluble polymer, which is obtained by polymerization of a monomer (A) represented by formula (1) with a radical polymerizable monomer (B) other than the monomer (A):

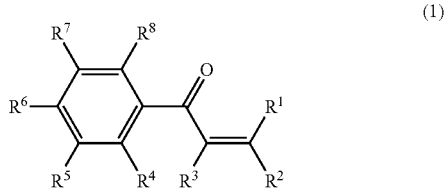

where: $R^1$, $R^2$, and $R^3$ each represent a hydrogen or an alkyl group having 1 to 3 carbon atoms in which any hydrogen may be replaced by a fluorine; and $R^4$, $R^5$, $R^6$, $R^7$, and $R^8$ each represent a hydrogen, a halogen, —CN, —$CF_3$, —$OCF_3$, or —OH, an alkyl group having 1 to 5 carbon atoms in which any —$CH_2$— may be replaced by —COO—, —OCO—, or —CO—, and any hydrogen may be replaced by a halogen, or an alkoxy group having 1 to 5 carbon atoms in which any hydrogen may be replaced by a halogen, provided that at least one of $R^4$ to $R^8$ is —OH, wherein the radical polymerizable monomer (B) includes one or more selected from the group consisting of a radical polymerizable monomer (b1) having an oxiranyl group; a radical polymerizable monomer (b2) having an oxetanyl group; a radical polymerizable monomer (b3) having an N-substituted maleimide: and a radical polymerizable monomer (b4) having a tricycle [5.2.1.0$^{2,6}$] decanyl group.

2. The alkali soluble polymer according to claim 1, wherein the $R^1$ to $R^5$, $R^7$, and $R^8$ each represent a hydrogen and the $R^6$ represents —OH.

3. The alkali soluble polymer according to claim 1, wherein the radical polymerizable monomer (B) includes one or both of the radical polymerizable monomer (b1) and the radical polymerizable monomer (b2).

4. The alkali soluble polymer according to claim 3, wherein the radical polymerizable monomer (B) consists of the radical polymerizable monomer (b1), the radical polymerizable monomer (b2), and a radical polymerizable monomer (b5) other than the radical polymerizable monomers (b1) to (b4).

5. The alkali soluble polymer according to claim 4, wherein:
the radical polymerizable monomer (b1) is one or two or more selected from the group of glycidyl acrylate, glycidyl methacrylate, and methyl glycidyl methacrylate;
the radical polymerizable monomer (b2) is one or two or more selected from the group of (3-ethyl-3-oxetanyl)methyl acrylate, (3-ethyl-3-oxetanyl)methyl methacrylate, (2-ethyl-2-oxetanyl) methyl acrylate, and (2-ethyl-2-oxetanyl)methyl methacrylate;
the radical polymerizable monomer (b3) is one or both of N-phenyl maleimide and N-cyclohexyl maleimide; and
the radical polymerizable monomer (b4) is tricyclo [5.2.1.0$^{2,6}$] decanyl methacrylate.

6. The alkali soluble polymer according to claim 4, wherein the radical polymerizable monomer (b5) is one or both of benzyl methacrylate and styrene.

7. The alkali soluble polymer according to claim 3, wherein the radical polymerizable monomer (B) consists of the radical polymerizable monomers (b1), (b2), and (b3).

8. The alkali soluble polymer according to claim 7, wherein:
the radical polymerizable monomer (b1) is one or two or more selected from the group of glycidyl acrylate, glycidyl methacrylate, and methyl glycidyl methacrylate;
the radical polymerizable monomer (b2) is one or two or more selected from the group of (3-ethyl-3-oxetanyl) methyl acrylate, (3-ethyl-3-oxetanyl)methyl methacrylate, (2-ethyl-2-oxetanyl)methyl acrylate, and (2-ethyl-2-oxetanyl)methyl methacrylate;
the radical polymerizable monomer (b3) is one or both of N-phenyl maleimide and N-cyclohexyl maleimide; and
the radical polymerizable monomer (b4) is tricyclol [5.2.1.0$^{2,6}$]decanyl methacrylate.

9. The alkali soluble polymer according to claim 3, wherein the radical polymerizable monomer (B) consists of the radical polymerizable monomers (b1), (b2), and (b4).

10. The alkali soluble polymer according to claim 9, wherein:
the radical polymerizable monomer (b1) is one or two or more selected from the group of glycidyl acrylate, glycidyl methacrylate, and methyl glycidyl methacrylate;
the radical polymerizable monomer (b2) is one or two or more selected from the group of (3-ethyl-3-oxetanyl) methyl acrylate, (3-ethyl-3-oxetanyl)methyl methacrylate, (2-ethyl-2-oxetanyl)methyl acrylate, and (2-ethyl-2-oxetanyl)methyl methacrylate;
the radical polymerizable monomer (b3) is one or both of N-phenyl maleimide and N-cyclohexyl maleimide; and
the radical polymerizable monomer (b4) is tricycle [5.2.1.0$^{2,6}$]decanyl methacrylate.

11. The alkali soluble polymer according to claim 3, wherein the radical polymerizable monomer (B) consists of the radical polymerizable monomers (b1), (b3), and (b4).

12. The alkali soluble polymer according to claim 11, wherein:
the radical polymerizable monomer (b1) is one or two or more selected from the group of glycidyl acrylate, glycidyl methacrylate, and methyl glycidyl methacrylate;
the radical polymerizable monomer (b2) is one or two or more selected from the group of (3-ethyl-3-oxetanyl) methyl acrylate, (3-ethyl-3-oxetanyl)methyl methacrylate, (2-ethyl-2-oxetanyl)methyl acrylate, and (2-ethyl-2-oxetanyl)methyl methacrylate;
the radical polymerizable monomer (b3) is one or both of N-phenyl maleimide and N-cyclohexyl maleimide; and
the radical polymerizable monomer (b4) is tricycle [5.2.1.0$^{2,6}$]decanyl methacrylate.

13. The alkali soluble polymer according to claim 3, wherein the radical polymerizable monomer (B) consists of the radical polymerizable monomers (b1).

14. The alkali soluble polymer according to claim 13, wherein:
the radical polymerizable monomer (b1) is one or two or more selected from the group of glycidyl acrylate, glycidyl methacrylate, and methyl glycidyl methacrylate;
the radical polymerizable monomer (b2) is one or two or more selected from the group of (3-ethyl-3-oxetanyl) methyl acrylate, (3-ethyl-3-oxetanyl)methyl methacrylate, (2-ethyl-2-oxetanyl)methyl acrylate, and (2-ethyl-2-oxetanyl)methyl methacrylate;
the radical polymerizable monomer (b3) is one or both of N-phenyl maleimide and N-cyclohexyl maleimide; and the radical polymerizable monomer (b4) is tricyclo [5.2.1.0$^{2,6}$]decanyl methacrylate.

15. The alkali soluble polymer according to claim 3, wherein the radical polymerizable monomer (B) consists of the radical polymerizable monomers (b1) and (b4).

16. The alkali soluble polymer according to claim 15, wherein:
the radical polymerizable monomer (b1) is one or two or more selected from the group of glycidyl acrylate, glycidyl methacrylate, and methyl glycidyl methacrylate;
the radical polymerizable monomer (b2) is one or two or more selected from the group of (3-ethyl-3-oxetanyl) meythyl acrylate, (3-ethyl-3-oxetanyl)methyl methacrylate, (2-ethyl-2-oxetanyl)methyl acrylate, and (2-ethyl-2-oxetanyl)methyl methacrylate;
the radical polymerizable monomer (b3) is one or both of N-phenyl maleimide and N-cyclohexyl maleimide; and
the radical polymerizable monomer (b4) is tricyclo [5.2.1.0$^{2,6}$]decanyl methacrylate.

17. A positive working photosensitive resin composition comprising the alkali soluble polymer according to claim 1 and a photosensitizing agent (C).

18. The positive working photosensitive resin composition according to claim 17, wherein the photosensitizing agent (C) is an acid generator compound.

19. The positive working photosensitive resin composition according to claim 17, wherein the photosensitizing agent (C) is a 1,2-quinone diazide compound.

* * * * *